US006262465B1

(12) United States Patent
Williamson et al.

(10) Patent No.: US 6,262,465 B1
(45) Date of Patent: Jul. 17, 2001

(54) HIGHLY-DOPED P-TYPE CONTACT FOR HIGH-SPEED, FRONT-SIDE ILLUMINATED PHOTODIODE

(75) Inventors: Steven L. Williamson, Ann Arbor, MI (US); Robert N. Sacks, Hilliard, OH (US); Janis A. Valdmanis, Dexter; Kadhair Al Hemyari, Dearborn, both of MI (US)

(73) Assignee: Picometrix, Inc., Ann Arbor, MI (US)

( * ) Notice: Subject to any disclaimer, the term of this patent is extended or adjusted under 35 U.S.C. 154(b) by 0 days.

(21) Appl. No.: 09/161,097

(22) Filed: Sep. 25, 1998

(51) Int. Cl.$^7$ .................................................. H01L 31/075
(52) U.S. Cl. ......................... 257/458; 257/459; 257/432; 257/434; 257/437; 257/189
(58) Field of Search ................... 257/458, 65, 189, 257/432, 434, 437, 459; 437/5; 359/72

(56) References Cited

U.S. PATENT DOCUMENTS

| 4,906,583 | * | 3/1990 | Kagawa et al. ..................... 437/5 |
| 5,134,681 | | 7/1992 | Ratovelomanana et al. . |
| 5,177,628 | * | 1/1993 | Moddel ................................... 349/28 |
| 5,193,131 | | 3/1993 | Bruno . |
| 5,387,544 | * | 2/1995 | Hayafuji ................................ 117/89 |
| 5,818,096 | * | 10/1998 | Ishibashi et al. .................... 257/458 |

FOREIGN PATENT DOCUMENTS 6-163985 * 6/1994 (JP).

OTHER PUBLICATIONS

"Physics of Semiconductor Devices", Second Edition, John Wiley & Sons, S.M. Sze, No Date.*
"In$_{53}$Ga$_{47}$As p–i–n Photodiodes with Transparent Cadmium Tin Oxide Contacts", American Institute of Physics, Berger et al., 1992.*
"In.53 Ga. 47As p–i–n photodiodes with transparent cadmium tin oxide contacts", American Institute of Physics, Berger et al., Jul. 1992.*
"Properties of Lattice–Matched & Strained Indium Gallium Arsenide", University of Michigan, Mar. 1993, Pallab Bhattacharya, Editor.

* cited by examiner

Primary Examiner—Matthew Smith
Assistant Examiner—Belur Keshavan
(74) Attorney, Agent, or Firm—Brinks Hofer Gilson & Lione

(57) ABSTRACT

A semiconductor p-i-n photodiode having a substrate, an n layer coupled to the surface of said substrate, an i layer coupled to the surface of said n layer, and a carbon doped p layer coupled to the surface of said i layer.

29 Claims, 3 Drawing Sheets

HIGHLY-DOPED P-TYPE CONTACT FOR HIGH-SPEED, FRONT-SIDE ILLUMINATED PHOTODIODE

BACKGROUND OF THE INVENTION

The present invention relates to an optoelectronic device that is used in fiber-optic communications. More specifically, the present invention relates to an improvement in the construction of a p-i-n photodetector to enhance its response time over an operating wavelength range from 700–1600 nanometers (nm).

The development of the Internet and other datacom networks has created an ever-increasing need for high rates of data transmission. Optical links, with their ultrawide bandwidth and low-distortion fiber transmission, are increasingly favored over traditional copper-wire approaches. Optical links operate at one of the following wavelengths: 780, 850, 1310, and 1550 nm, with 1310 nm and 1550 nm used primarily for long-haul applications, where their ability to propagate distortion-free in single-mode optical fiber is critical. For short-haul applications, which include workgroup LANs (local area networks) and campus backbones, the number of components implemented can be considerably higher, causing their costs to become a key factor. Short-haul networks are often designed to operate at the shorter 780 and 850 nm wavelengths, where directly-modulated lasers can be manufactured less expensively using VCSEL (vertical-cavity surface-emitting laser) technology. Multi-mode, 62.5 micrometer ($\mu$m) diameter fiber is the fiber of choice for these systems. This large a core fiber means that equally large-area detectors are required. Both Si- and GaAs-based photodetectors are available for this application, provided the modulation rate is below 1.25 Gbit/s (Gigabit Ethernet). Above 1.25 Gbit/s, GaAs detectors are preferred.

With 1.25 Gbit/s systems now being implemented, network providers have moved towards development of a 10 Gbit/s link that also uses 62.5-$\mu$m multi-mode fiber. This effort is at the research/development level and high-speed diagnostics are now needed for their characterization. In general, components that can operate at 10 Gbit/s need only have an 8 GHz bandwidth. One of the components that has proved difficult to develop is an 8-GHz photodetector that is sensitive to 780 nm and 850 nm light. GaAs-based detectors cannot satisfy both specifications. The limitation with GaAs stems from its low absorption coefficient at the shorter wavelengths. Indeed, GaAs-based 8 GHz detectors have been fabricated, provided the active region is no greater than 2 $\mu$m in thickness. This thickness assures that all the optically-generated electrons and holes sweep out sufficiently fast to achieve 8 GHz bandwidth. However, to obtain near unity quantum efficiency at 850 nm from a GaAs detector would require the active layer be >4 $\mu$m. This is feasible, by going double-pass through the 2-$\mu$m region, but is prohibitively expensive to manufacture and package. The situation improves somewhat for light at 780 nm. However, single-pass illumination through 2 $\mu$m would still result in less than unity quantum efficiency.

The ideal semiconductor for this application is $In_{0.53}Ga_{0.47}As$ grown lattice matched on semi-insulating InP (InP:Fe). $In_{0.53}Ga_{0.47}As$ has a lower bandgap than GaAs and can provide equivalent absorption at 850 nm with a quarter of the thickness. The 4 $\mu$m thickness required for full absorption in GaAs reduces to 1 $\mu$m in $In_{0.53}Ga_{0.47}As$. At this thickness, detector bandwidths can exceed 20 GHz. If a 2 $\mu$m $In_{0.53}Ga_{0.47}As$ layer is used, we can obtain the needed 8 GHz and also have strong absorption out to 1550 nm.

$In_{0.53}Ga_{0.47}As$-based p-i-n photodiodes have been available for some time for use at 1300 nm and 1550 nm. These photodiodes are heterostructures, consisting of an undoped, relatively thick $In_{0.53}Ga_{0.47}As$ active region sandwiched between thin, heavily-doped p and n $In_{0.52}Al_{0.48}As$ regions. These are most often back-side (substrate-side) illuminated detectors. The light propagates through both the substrate and transparent $In_{0.52}Al_{0.48}As$ n-doped layer before being absorbed by the active $In_{0.53}Ga_{0.47}As$ layer. The cut-off wavelength for back-side illumination is determined by the absorption edge of the InP and is 900 nm. For detection at 780 nm or 850 nm, a front-side design is needed, and requires that the p-doped top layer be transparent to allow passage of the light. A front-side illuminated p-i-n photodiode based on $In_{0.53}Ga_{0.47}As$ could, in principal, have quantum-limited sensitivity at 780 nm or 850 nm and also have a bandwidth of 8 GHz. What prevents this bandwidth from being realized is the sheet resistance of the transparent p-contact.

In addition to the sweep-out time discussed earlier, the response of a photodiode can be limited by its RC time constant. The RC time constant is the parasitic response of the photodiode and is the product of the diode's series resistance, R and capacitance, C. For a photodiode to collect all the light from a 62.5-$\mu$m core fiber (the most common fiber size for short-haul applications), it must have a diameter of at least 62.5 $\mu$m. Taking the active layer thickness to be 2 $\mu$m, yields a capacitance for a photodiode of ~0.2 pF. For the case of a back-sided illuminated detector, the total series resistance can range from 20–50 $\Omega$, depending on the contribution from contact resistance and the resistance of the n-doped layer. For this detector, we must rely on lateral conduction through the n-doped layer to transport charge, and so the sheet resistance value for the n-layer is critical. The resistivity of a layer doped with shallow donors can be reduced by increasing the dopant concentration. The most widely used shallow donor for n-type contacts is tin (Sn). Sn can be doped to a level of $10^{20}$ cm$^{-3}$ before diffusion becomes a problem. At this concentration, the resistance for the n-doped layer is ~20 $\Omega$, for a 700-nm thickness. Note that this layer, though relatively thick, is transparent to 1300 nm and 1550 nm light. At the opposing contact is the p-doped layer. For a back-side illuminated detector this contact can be covered with a thin metal film on its outer surface to reduce its sheet resistance to <1 $\Omega$. If this photodiode were limited only by its RC parasitics (i.e. no sweep-out limitations), it would have a 10 picosecond (ps) response. In an typical back-side illuminated detector with a 2-$\mu$m active layer, the RC time constant is faster than the charge sweep out time (~30 ps). Assuming Gaussian pulse profiles, the combined contribution from the two time constants is $(10^2+30^2)^{1/2}=32$ ps, which corresponds to ~8 GHz bandwidth.

The situation changes for a front-side illuminated photodiode. For this geometry, the p-doped $In_{0.52}Al_{0.48}As$ contact can no longer have a metal top coating The detector must rely on lateral conduction from both the n- and p-doped layers. To hold optical losses to $\leq$20% at 850 nm also requires the thickness of the p-layer be $\leq$400 nm. This challenge is further complicated by the fact that beryllium (Be) and zinc (Zn), the industry's standard p-dopants, cannot be doped to the same $10^{20}$ cm$^{-3}$ concentration as done with Sn in the n-doped layer. This is because Be and Zn have a much higher diffusion coefficient than Sn. Above $5\times10^{18}$ cm$^{-3}$, Be, for example, begins to diffuse into neighboring regions moving most rapidly along defect channels. This causes Be to contaminate the undoped i-region of our p-i-n photodiode and greatly increases its dark current, or worse, shorts the diode. If we limit our Be concentration to a safe level ($\leq 5\times10^{18}$ cm$^{-3}$), where Be diffusion is minimal, the resistance for the p-doped layer could be as high as 50Ω. The bandwidth of this front-side detector degrades from 8 GHz to <5 GHz.

SUMMARY OF THE INVENTION

The present invention comprises a p-i-n photodiode having a transparent p contact through which light passes from the top of the photodiode. The incident light has a direct path to the active i region. This avoids attenuation of the above-bandgap light ($\lambda \leq 900$ nm) that would otherwise occur if the light had to pass through the substrate. The top-side illuminated design enables wavelengths as short as 700 nm to be detected by the active region. At the heart of the present invention is a new application for carbon doping in $In_{0.52}Al_{0.48}As$. Carbon is incorporated as a p-type dopant in $In_{0.52}Al_{0.48}As$ to make a highly conductive p layer that also serves as the top window for the photodiode. The high electrical conductivity of this layer allows us to design a high-speed photodiode without needing a metal top layer, thereby making light accessible from the top surface. Carbon has been found to be superior to Be and Zn, the most common type p-dopants, in its ability to remain stationary during the epitaxial growth process. After growth and subsequent microfabrication, the carbon shows no signs of diffusion out of the $In_{0.52}Al_{0.48}As$ region and into the i region of the p-i-n photodiode. High concentrations of carbon ($10^{20}$ cm$^{-3}$ vs. $\leq 5\times10^{18}$ cm$^{-3}$ with Be) can be incorporated into the $In_{0.52}Al_{0.48}As$ layer without degrading the diode. By increasing the p-layer's dopant level we can lower its series resistance and, in turn, the photodiode's RC time constant. A lower RC time constant has the effect of increasing the detector's response.

DETAILED DESCRIPTION OF THE PREFERRED EMBODIMENT

Figure 1:
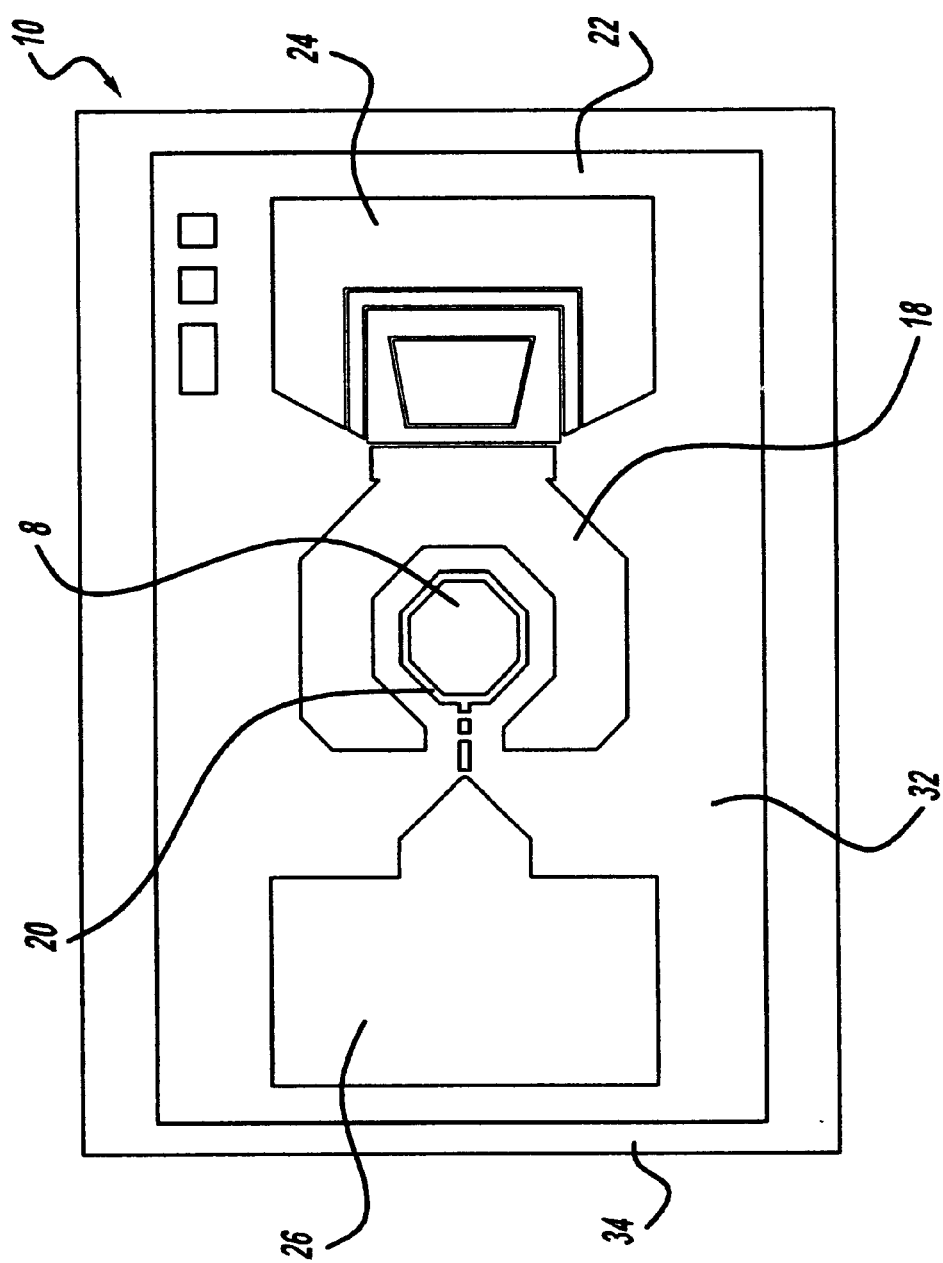
FIG. 1 is a photomicrograph of the p-i-n photodetector of the present invention.
Figure 2:
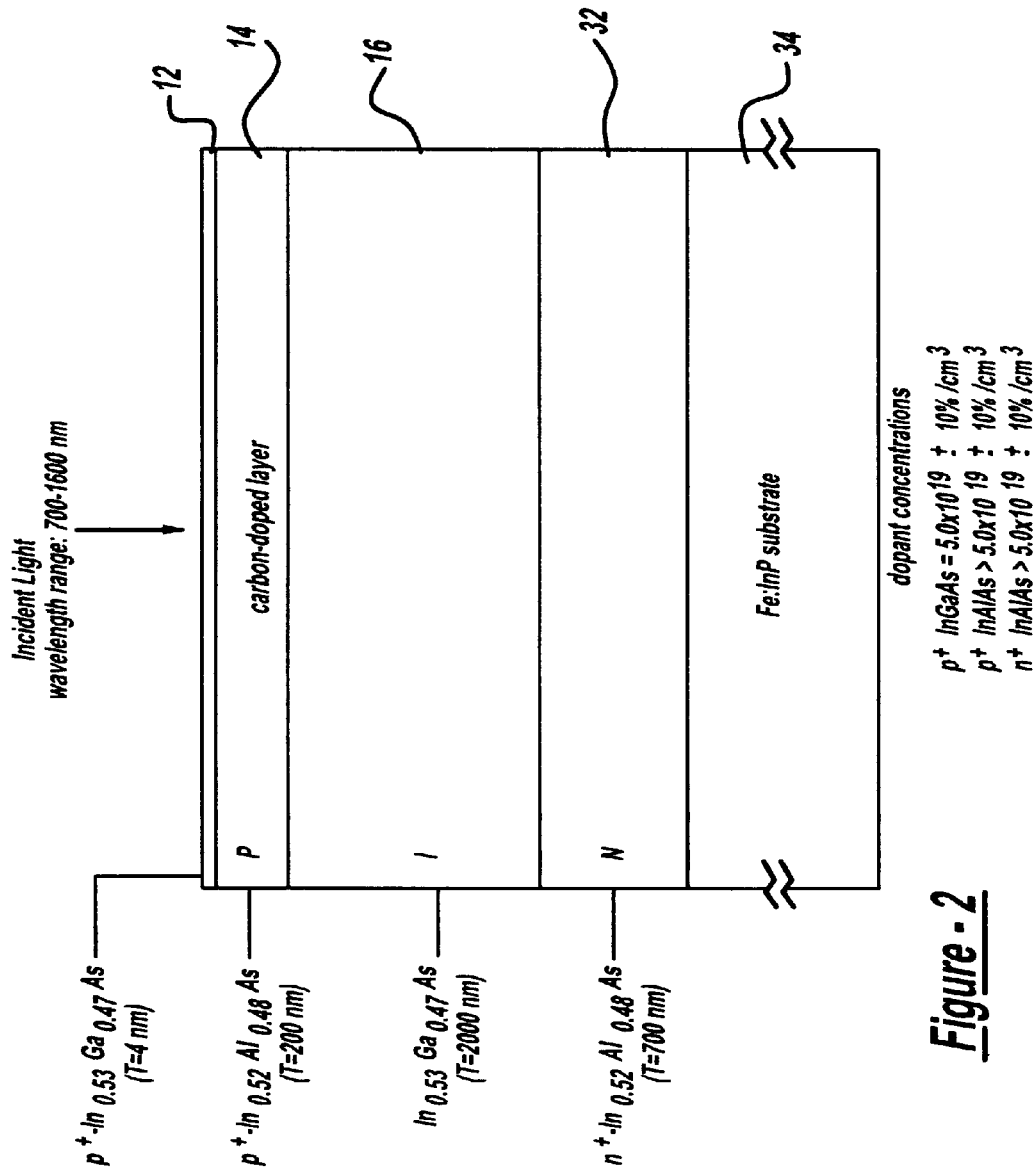
FIG. 2 is the epitaxial growth profile for the p-i-n structure of the present invention.

Referring to FIGS. 1 and 2, the photodetector 10 of the present invention is shown in a plan and profile view. The octagonal region 8 is the p-i-n mesa where detection of light takes place. The p-i-n is grown lattice-matched on InP:Fe substrate 34. The mesa is formed by chemically etching through the top layers to the InP substrate. The mesa stands a few micrometers above the InP substrate 34 surface. The top of the mesa is a thin (nominally 4-nm thickness but can be any thickness which may protect the underlying structure) $In_{0.53}Ga_{0.47}As$ layer 12 that protects the $In_{0.52}Al_{0.48}As$ p-layer 14. The $In_{0.53}Ga_{0.47}As$ cap layer 12 is doped to $5\times10^{19}$ cm$^{-3}$ to provide good elecrical conduction but can be doped to any alternate level which conducts electricity. This layer serves to seal the $In_{0.52}Al_{0.48}As$ layer 14 from the atmosphere. The aluminum in $In_{0.52}Al_{0.48}As$ p-layer 14 could otherwise react with oxygen (possibly during microfabrication) and form an insulating layer. The $In_{0.53}Ga_{0.47}As$ cap 12 is grown thin to avoid appreciable absorption. The p-doped $In_{0.52}Al_{0.48}As$ top layer 14 is the layer that is transparent to incoming light. On one hand, this layer needs to be sufficiently thick to provide low series resistance while, on the other hand, thin enough to minimize absorption. Light that is absorbed within this layer will lower the detector's responsivity and could also slow its response time. The preferred thickness of the p-layer 14 is between 100 nm and 300 nm to allow wavelengths from 700–1600 nm to transmit with minimal absorption. The carbon doping of the p-layer 14 allows for higher doping concentration (>$5.0\times10^{19}$ cm$^{-3}$ and preferably to $10^{20}$ cm$^{-3}$) than is possible with Be or Zn. Be or Zn will begin to migrate beyond the layer's interface at such high doping levels and can cause the diode to electrically short. This increase in doping concentration will significantly reduce the resistance of the p-layer of the photodiode and the associated RC time constants, leading to faster activation speeds.

Along the perimeter of the $In_{0.53}Ga_{0.47}As$ layer 12 is a narrow metal ring 20. This is the metal contact that electrically connects the p-layer 14 to the p bond pad 26. The metal ring 20 is preferably made of gold. The metal ring 20 is preferably formed around the perimeter of the cap layer 12 so that the metal ring 20 will not occlude light directed at the surface of the photodetector. Beneath the $In_{0.52}Al_{0.48}As$ p-layer 14 is the i-layer 16, or the active region of the photodetector. The i-layer has the same planar dimensions as the p-layer The i-layer 16 is formed of undoped $In_{0.53}Ga_{0.47}As$. This is where the incident light is absorbed and where the electric-field is the highest within the diode. The thicker the i-layer 16, the higher the absorption. If the i-layer 16 is made too thick, the charge sweep-out time through the layer may limit the speed of the detector.

Below the i-layer 16 is the n-contact layer 32 formed of Sn-doped $In_{0.52}Al_{0.48}As$. The preferred dopant concentration is $\geq 5\times10^{19}$ cm$^{-3}$. This layer is preferably grown between 500–1000 nm in thickness. The n-layer 32 extends beyond the mesa to provide a large surface area for contacting to the n-contact electrode 18. The n-contact electrode 18 is electrically-connected to the n-contact bond pad 24. An anti-reflection coating 22 is deposited over the full surface and windows are formed over the bond pads for electrical connection. The anti-reflection coating 22 can be designed to cover a broad range of wavelengths.

Figure 3:
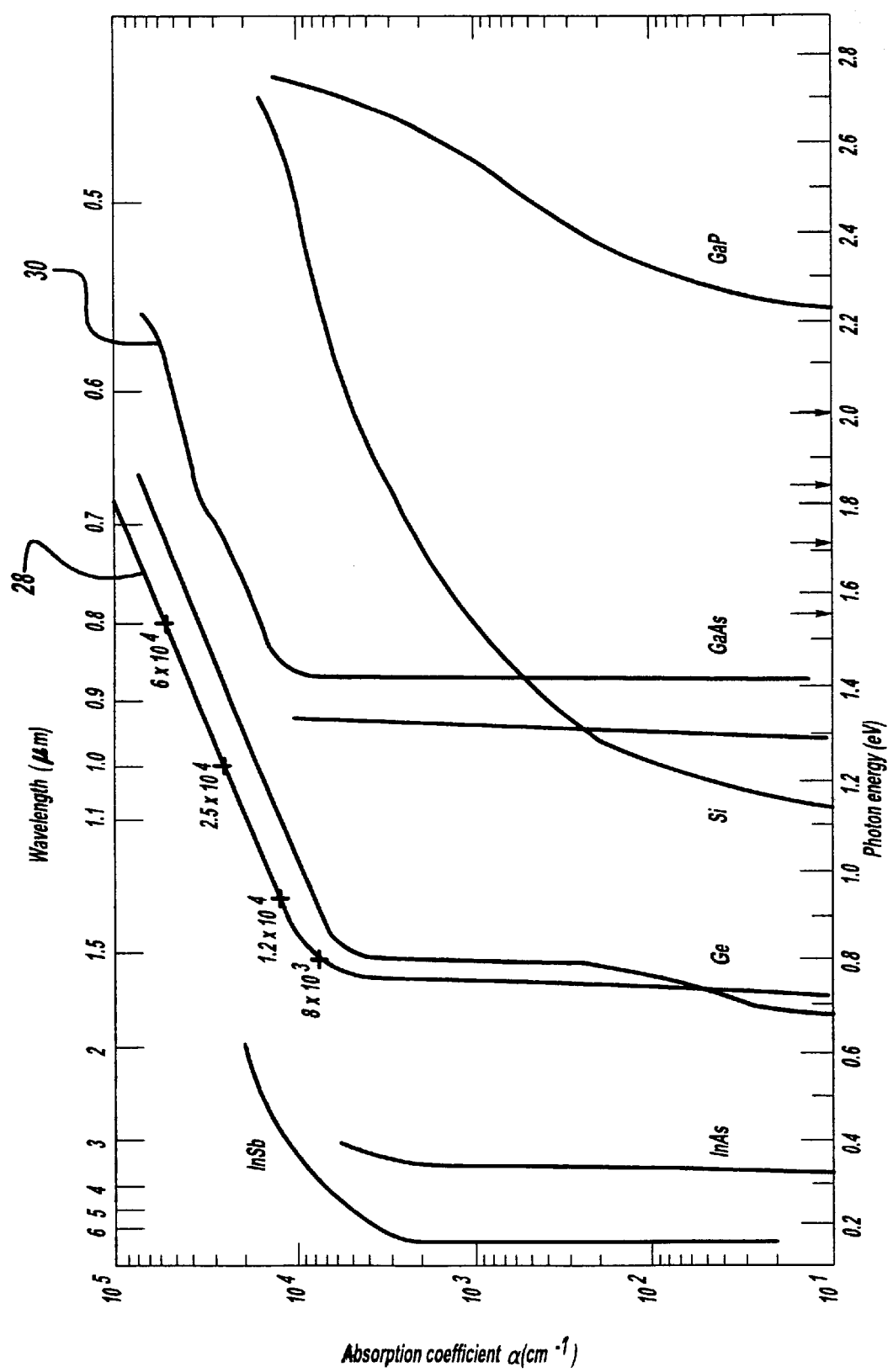
FIG. 3 is a plot of the intrinsic absorption curves of semiconductor materials vs. the wavelength of light.

Referring to FIG. 3, absorption of light in the i-layer 16 is related to the absorption coefficient by the following equation:

$$I=I_0 e^{(-\alpha T)}$$

where:

$I_0$=incident light level
$\alpha$=absorption coefficient, in cm$^{-1}$
T=thickness of the absorber (i.e. i layer), in cm.
For GaAs curve 30 at $\lambda$=850 nm, $\alpha$=$10^4$ cm$^{-1}$.
Taking a thickness value of T=$2\times10^{-4}$ cm, yields I=0.135×$I_0$, or ~86% of the light is absorbed by the i region (i.e. detected) and the remainder is absorbed by the InP substrate (lost).

For $In_{0.53}Ga_{0.47}As$ curve 28 at $\lambda$=850 nm, $\alpha$=$4\times10^4$ cm$^{-1}$. For the same thickness active layer, I=0.0003×$I_0$, that is, essentially all the light is detected.

The p-i-n detector can, in principle, be grown inverted, starting with the p-doped $In_{0.52}Al_{0.48}As$ layer in contact with the InP:Fe substrate and finishing with the n-doped $In_{0.52}Al_{0.48}As$ layer. In this structure, the p-layer would be grown with a thickness of 700 nm and the n-layer would be grown with a thickness of 200 nm. An n-doped $In_{0.53}Ga_{0.47}As$ cap layer would need to replace the p-doped $In_{0.53}Ga_{0.47}As$ layer. This n-i-p photodiode structure is possible since both the n- and p-type layers are doped $>5\times10^{19}$ cm$^{-3}$.

The detector is formed through standard IC fabrication technology as known to one skilled in the art of molecular beam epitaxy, or other epitaxial growth techniques or processes that can utilize carbon as a p-dopant. It is to be understood that the invention is not limited to the exact construction illustrated and described above, but that various changes and modifications may be made without departing from the spirit and scope of the invention as defined in the following claims.

What is claimed is:

1. A semiconductor p-i-n photodiode comprising:
    a substrate;
    an n-layer coupled to a surface of said substrate;
    an i-layer coupled to a surface of said n layer; and
    a carbon doped p-layer coupled to the surface of said i layer, wherein said photodiode is activated by electromagnetic radiation having a wavelength range from 700 nm to 1600 nm.

2. The photodiode of claim 1 further comprising a cap layer coupled to the surface of said carbon doped p-layer.

3. The photodiode of claim 2, wherein said cap layer is transparent to light, whereby said light may activate said photodiode.

4. The photodiode of claim 2, wherein said cap layer is comprised of $In_{0.53}Ga_{0.47}As$.

5. The photodiode of claim 2 further comprising a conductive ring coupled to the surface of said cap layer, said conductive ring coupled to an electrode.

6. The photodiode of claim 1, wherein said carbon doped p-layer is comprised of $In_{0.52}Al_{0.48}As$.

7. The photodiode of claim 1, wherein said i-layer is comprised of $In_{0.53}Ga_{0.47}As$.

8. The photodiode of claim 1, wherein said n-layer is comprised of $In_{0.52}Al_{0.48}As$.

9. The photodetector of claim 1, wherein said carbon doping has concentrations up to $1\times10^{20}$ cm$^{-3}$.

10. The photodiode of claim 1, wherein said i-layer is sandwiched between said carbon doped p-layer and said n-layer.

11. The photodiode of claim 1, wherein said carbon doped p-layer is less than or equal to 200 nm thick.

12. The semiconductor photodetector of claim 1, wherein said photodiode is used in telecommunication applications for optical switching and is switched by incident light.

13. A semiconductor photodetector comprising:
    a substrate;
    an n-layer coupled to the surface of said substrate;
    an i-layer coupled to the surface of said n-layer;
    a carbon doped p-layer coupled to the surface of said i-layer;
    wherein said i-layer is sandwiched between said p-layer and said n-layer to form a photodiode and said n, i, and p-layer are oriented to form a n-i-p photodiode; and
    wherein said n-i-p photodiode is activated by electromagnetic radiation having a wavelength range from 700 nm to 1600 nm.

14. The semiconductor photodetector of claim 13, wherein said n-layer is less than or equal to 200.0 nm thick.

15. The semiconductor photodetector of claim 13, wherein said carbon doping has a concentration up to $1\times10^{20}$ cm$^{-3}$.

16. A semiconductor p-i-n photodiode comprising:
    a substrate;
    an n-layer coupled to the surface of said substrate;
    an i-layer coupled to the surface of said n layer; and
    a carbon doped p-layer coupled to the surface of said i layer having a thickness less than or equal to 200 nm.

17. The photodiode of claim 16 further comprising a cap layer coupled to the surface of said carbon doped p-layer.

18. The photodiode of claim 17 wherein said cap layer is transparent to light.

19. The photodiode of claim 17, wherein said cap layer is comprised of $In_{0.53}Ga_{0.47}As$.

20. The photodiode of claim 17 further comprising a conductive ring coupled to the surface of said cap layer, said conductive ring coupled to an electrode.

21. The photodiode of claim 16, wherein said carbon doped p-layer is comprised of $In_{0.52}Al_{0.48}As$.

22. The photodiode of claim 16, wherein said i-layer is comprised of $In_{0.53}Ga_{0.47}As$.

23. The photodiode of claim 16, wherein said n-layer is comprised of $In_{0.52}Al_{0.48}As$.

24. The photodetector of claim 16, wherein said carbon doping has concentrations up to $1\times10^{20}$ cm$^{-3}$.

25. The photodiode of claim 16, wherein said i-layer is sandwiched between said carbon doped p-layer and said n-layer.

26. The photodiode of claim 16, wherein said photodiode is activated by electromagnetic radiation having a wavelength range from 700 nm to 1600 nm.

27. A semiconductor photodetector comprising:
    a substrate;
    an n-layer coupled to the surface of said substrate wherein said n-layer is less than or equal to 200.0 nm thick;
    an i-layer coupled to the surface of said n-layer;
    a carbon doped p-layer coupled to the surface of said i-layer; and
    wherein said i-layer is sandwiched between said p-layer and said n-layer to form a photodiode and said n, i, and p-layer are oriented to form a n-i-p photodiode.

28. The semiconductor photodetector of claim 27, wherein said n-i-p photodiode is activated by electromagnetic radiation having a wavelength range from 700 nm to 1600 nm.

29. The semiconductor photodetector of claim 27, wherein said carbon doping has a concentration up to $1\times10^{20}$ cm$^{-3}$.

* * * * *